United States Patent [19]
Lee

[11] Patent Number: 6,096,623
[45] Date of Patent: Aug. 1, 2000

[54] METHOD FOR FORMING SHALLOW TRENCH ISOLATION STRUCTURE

[75] Inventor: Claymens Lee, Kaohsiung Hsien, Taiwan

[73] Assignees: United Semiconductor Corp.; United Microelectronic Corp.

[21] Appl. No.: 09/392,924

[22] Filed: Sep. 9, 1999

[51] Int. Cl.⁷ .................................................. H01L 21/76
[52] U.S. Cl. ........................ 438/425; 438/424; 438/426; 438/437
[58] Field of Search ..................... 428/424, 425, 428/426, 427, 435, 437; 148/DIG. 50

[56] References Cited

U.S. PATENT DOCUMENTS

| | | | |
|---|---|---|---|
| 4,389,294 | 6/1983 | Anantha et al. | 204/192 E |
| 5,733,383 | 3/1998 | Fazan et al. | 148/33.3 |
| 5,930,620 | 7/1999 | Wristers et al. | 438/424 |
| 5,960,298 | 9/1999 | Kim | 438/424 |
| 5,989,978 | 11/1999 | Peidous | 438/436 |

*Primary Examiner*—Trung Dang
*Attorney, Agent, or Firm*—Charles C.H. Wu; Charles C.H. Wu & Associates

[57] ABSTRACT

A method for forming a shallow trench isolation structure. A pad oxide layer is formed over a substrate. A hard mask layer is formed over the pad oxide layer. A portion of the hard mask layer, the pad oxide layer and the substrate is removed to form a trench in the substrate. Insulation material is deposited into the trench to form an insulation plug. The hard mask layer is removed to expose the sidewalls of the insulation plug. Spacers are formed on the exposed sidewalls of the insulation plug. Ions are implanted into the substrate. The pad oxide layer, the spacers and a portion of the insulation plug are removed. Finally, a gate oxide layer thicker in region around the edge of the insulation plug is formed over the substrate by oxidation.

12 Claims, 3 Drawing Sheets

METHOD FOR FORMING SHALLOW TRENCH ISOLATION STRUCTURE

BACKGROUND OF THE INVENTION

1. Field of the Invention

The present invention relates to a method for forming a semiconductor device. More particularly, the present invention relates to a method for forming shallow trench isolation (STI) structures.

2. Description of the Related Art

Advances in the production of integrated circuits have led to an increase in the level of integration and the miniaturization of semiconductor devices. As the level of integration increases, both the dimensions of each device and size of the isolating structures between devices are reduced. Consequently, device isolation structures are increasingly harder to form. Device isolation structures such as a field oxide layer formed by local oxidation (LOCOS) is no longer suitable for small dimensional device due to the intensification of bird's beak encroachment problem. Therefore, shallow trench isolation (STI) method has been developed for highly integrated circuits, and sub-half micron integrated circuits in particular.

In general, a shallow trench isolation (STI) structure is formed by performing an anisotropic etching operation using a silicon nitride hard mask to form a steep-sided trench in a semiconductor substrate. Oxide material is deposited into the trench to form an oxide plug. However, the aforementioned method of STI fabrication often results in the formation of recess cavities, resulting in locally intensified electric field. This leads to an abnormal sub-threshold current leakage in the transistor channel, resulting in the intensification of the kink effect. Hence, the transistor can no longer operate normally and reliably.

SUMMARY OF THE INVENTION

Accordingly, one object of the present invention is to provide a method for forming a shallow trench isolation (STI) structure capable of preventing the formation of any recess cavities around the edge region of its insulation plugs.

To achieve these and other advantages and in accordance with the purpose of the invention, as embodied and broadly described herein, the invention provides a method for forming a STI structure. A pad oxide layer is formed over a substrate. A hard mask layer is formed over the pad oxide layer. A portion of the hard mask layer, the pad oxide layer and the substrate is removed to form a trench in the substrate. Insulation material is deposited into the trench to form an insulation plug. The hard mask layer is removed to expose the sidewalls of the insulation plug. Spacers are formed on the exposed sidewalls of the insulation plug. Ions are implanted into the substrate. The pad oxide layer, the spacers and a portion of the insulation plug are removed and then an oxide layer is formed over the substrate by oxidation.

The invention also provides an alternative method for forming a STI structure. A trench is formed in a substrate. Insulation material is next deposited into the trench to form an insulation plug that rises to a level above the top surface of the substrate. Spacers are formed on the exposed sidewalls of the insulation plug. Ions are implanted into the substrate. An oxide layer is formed over the substrate by oxidation.

In this invention, a thicker gate oxide layer is formed around the edge of the insulation plugs, so as to reduce the electric field. Therefore, the kick effect generated from a locally intensified electric field is compensated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
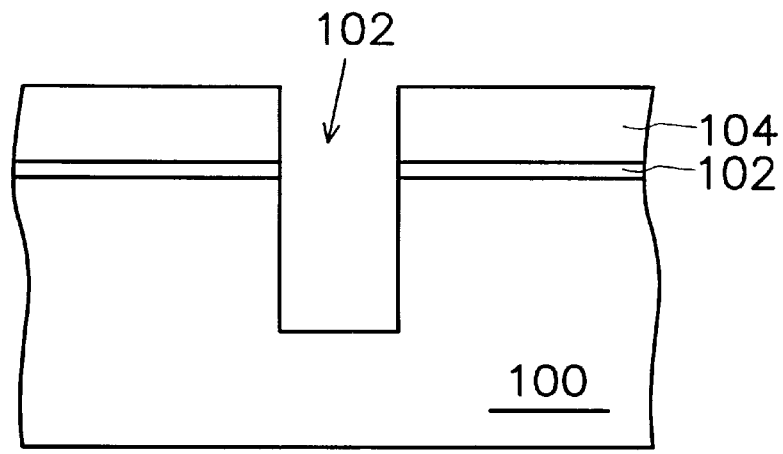
FIGS. 1A through 1H are schematic cross-sectional views showing the progression of manufacturing steps for producing a shallow trench isolation structure according to this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1H are schematic cross-sectional views showing the progression of manufacturing steps for producing a shallow trench isolation structure according to this invention.

As shown in FIG. 1A, a pad oxide layer 102 is formed over a silicon substrate 100. The pad oxide layer 102 protects the substrate 100 against subsequent processing operations. In general, the pad oxide layer 102 is formed by chemical vapor deposition, and is removed before the deposition of a gate oxide. A hard mask layer 104 is formed over the pad oxide layer 102. Using photolithographic and etching processes, the mask layer 104 is patterned to expose a portion of the pad oxide layer 102. The exposed pad oxide layer 102 and the substrate 100 are sequentially etched to form a trench 106 in the substrate 100.

Figure 1B:
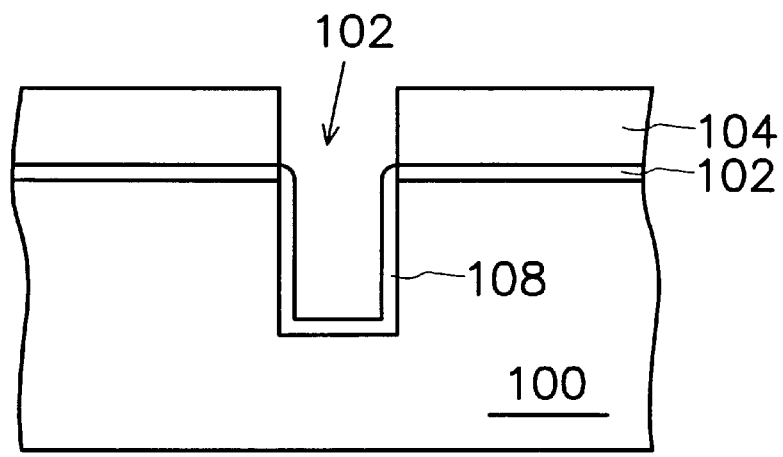

As shown in FIG. 1B, a liner oxide layer 108 is formed on the exposed substrate surface inside the trench 106 by oxidation.

Figure 1C:
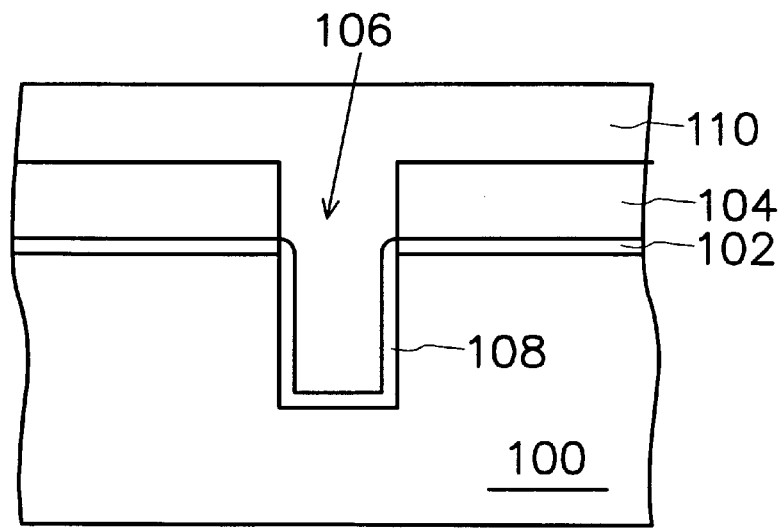

As shown in FIG. 1C, an insulation layer 110 that also completely fills the trench 106 is formed over the hard mask layer 104. The insulation layer 110 can be an oxide layer formed, for example, by atmospheric pressure chemical vapor deposition (APCVD). The insulation layer 110 is next densified to form a structurally finer and denser layer. Note that actual thickness of the insulation layer 110 is largely determined by the actual depth of the trench 106 and thickness of other deposited layers.

Figure 1D:
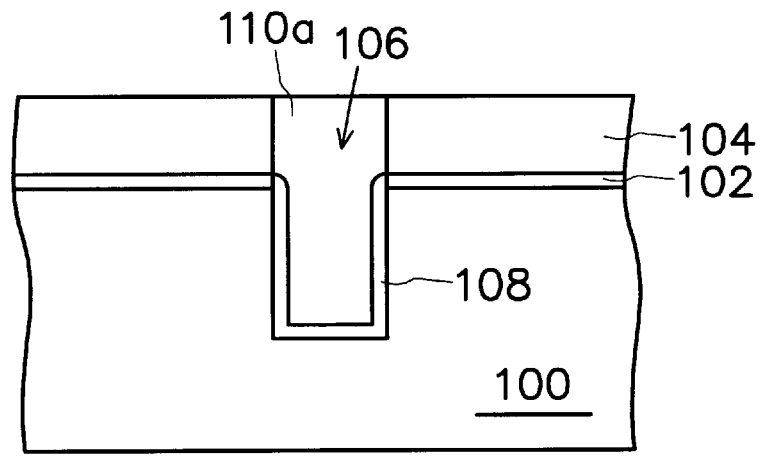
Figure 1E:
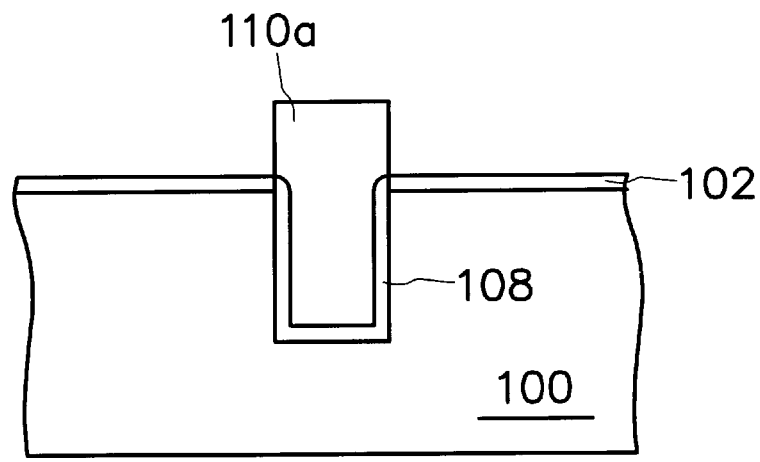

As shown in FIG. 1D, using the hard mask layer 104 as a stop layer, a chemical-mechanical polishing (CMP) or an etching back operation is carried out to remove a portion of the insulation layer 110. Hence, an insulation plug 110a is formed inside the trench 106.

The hard mask layer 104 is removed to expose a portion of the insulation plug 110a and the pad oxide layer 102 as shown in FIG. 1. The hard mask layer 104 can be removed, for example, by wet etching.

Figure 1F:
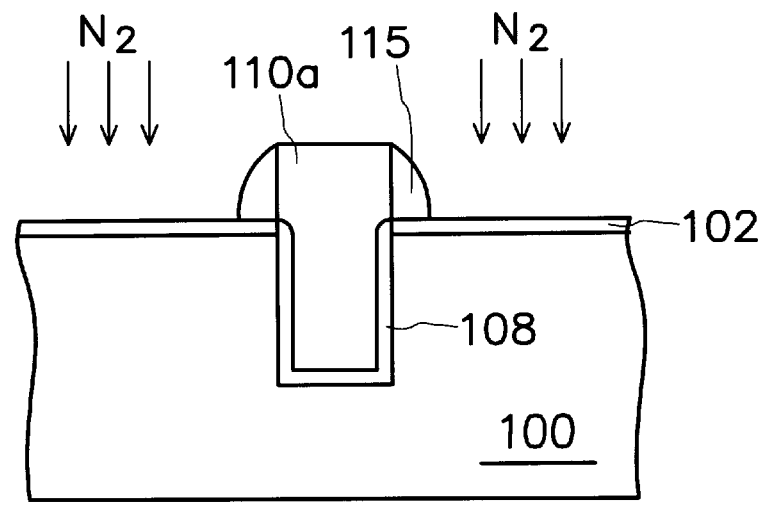

As shown in FIG. 1F, spacers 115 are formed on the sidewalls of the exposed insulation plug 110a. The spacers 115 are formed, for example, by forming a conformal oxide layer over the pad oxide layer 102 and the insulation plug 110a followed by an etching back step to remove most of the oxide material. Using the insulation plug 110a and the spacers 115 as a mask, an ion implantation is carried out to implant $N_2$ ions into the active region of the substrate, resulting in a concentration of about $10^{14}$~$10^{15}$ atoms/cm$^3$ therein.

Figure 1G:
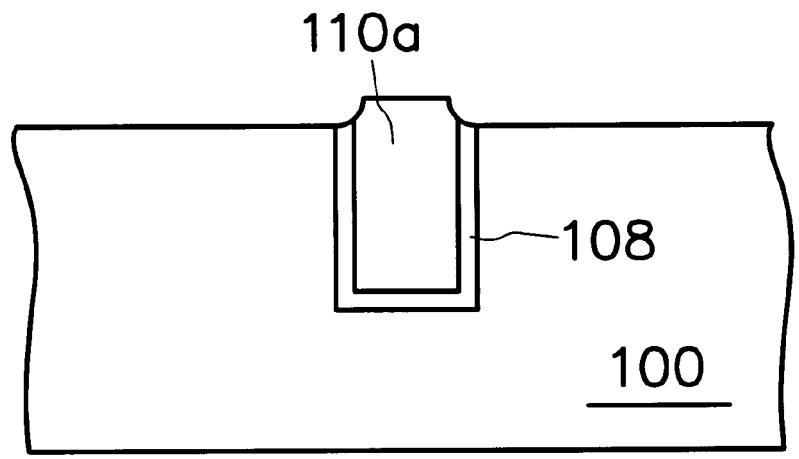

As shown in FIG. 1G, the pad oxide layer 102 (FIG. 1F) is removed by, for example, a wet etching operation using a hydrofluoric (HF) acid solution. A portion of the spacer 115 (FIG. 1F) and a portion of the isolation plug 110a are removed while removing the pad oxide layer 102 (FIG. 1F).

Figure 1H:
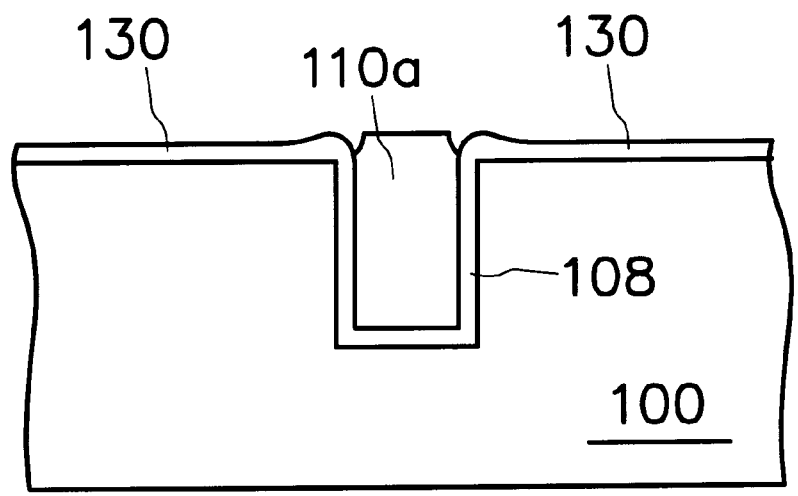

As shown in FIG. 1H, a sacrificial oxide layer (not shown) is formed over the substrate 100, and then the sacrificial oxide layer is removed. An oxidation process is conducted to form a gate oxide layer 130 inside the active region. Since spacers 115 provided a barrier to $N_2$ ions during ion implantation, there are fewer $N_2$ ions around the edge of the insulation plug 110a. Since a higher concentration of $N_2$ ions in the active region delays the formation of oxide in an oxidation process, the oxide layer 130 is thicker in the region around the insulation plug 110a. The thicker gate oxide around the edge region of the insulation plug 110a causes subsequently formed parasitic capacitors to have a low sub-threshold current leakage. The low sub-threshold current leakage is able to compensate for the low threshold voltage due to a locally intensified electric field.

In summary, a thicker gate oxide around the edge region of the insulation plug results in a low sub-threshold current leakage in the subsequently formed parasitic capacitors. The low sub-threshold current leakage is able to compensate for the low threshold voltage due to a locally intensified electric field.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming shallow trench isolation structure, comprising the steps of:

providing a substrate;

forming a pad oxide layer over the substrate;

forming a hard mask layer over the pad oxide layer;

removing a portion of the hard mask layer, the pad oxide layer and the substrate to form a trench in the substrate;

depositing an insulation material into the trench to form an insulation plug;

removing the hard mask layer;

forming spacers on sidewalls of the exposed insulation plug;

performing an ion implantation;

removing the pad oxide layer, the spacers and a portion of the insulation plug; and performing an oxidation.

2. The method of claim 1, wherein the step of forming the hard mask layer includes depositing silicon nitride.

3. The method of claim 1, wherein the step of removing the hard mask layer includes wet etching.

4. The method of claim 1, wherein the step of forming the insulation plug further includes the substeps of:

forming an insulation layer over the substrate;

densifying the insulation layer; and performing a chemical-mechanical polishing operation using the hard mask layer as a polishing stop layer.

5. The method of claim 1, wherein the step of removing the pad oxide layer, the spacers and the portion of the insulation plug includes wet etching.

6. The method of claim 1, wherein the step of performing the ion implantation includes implanting $N_2$ ions.

7. The method of claim 1, wherein concentration of implanted ions is about $10^{14}$ to about $10^{15}$ atoms/cm$^3$.

8. A method for forming a shallow trench isolation structure, comprising the steps of:

providing a substrate;

forming a trench in the substrate;

depositing an insulation material into the trench to form an insulation plug such that a top surface of the insulation plug is at a higher level than a substrate surface;

forming spacers on the sidewalls of the exposed insulation plug;

performing an ion implantation;

removing the spacers and a portion of the insulation plug; and performing an oxidation.

9. The method of claim 8, wherein the step of forming the insulation plug further includes the substeps of:

forming an insulation layer over the substrate;

densifying the insulation layer; and performing a chemical-mechanical polishing operation using the hard mask layer as a polishing stop layer.

10. The method of claim 8, wherein the step of removing the spacers and a portion of the insulation plug includes wet etching.

11. The method of claim 8, wherein the step of performing an ion implantation includes implanting $N_2$ ions.

12. The method of claim 8, wherein concentration of implanted ions is about $10^{14}$ to about $10^{15}$ atoms/cm$^3$.

* * * * *